United States Patent [19]

Aoai et al.

[11] Patent Number: 5,204,217

[45] Date of Patent: Apr. 20, 1993

[54] PHOTOSENSITIVE COMPOSITION

[75] Inventors: Toshiaki Aoai; Mitsunori Ono, both of Shizuoka, Japan

[73] Assignee: Fuji Photo Film Co., Ltd., Kanagawa, Japan

[21] Appl. No.: 641,834

[22] Filed: Jan. 16, 1991

[30] Foreign Application Priority Data

Jan. 16, 1990 [JP] Japan .................................. 2-6806
Jan. 16, 1990 [JP] Japan .................................. 2-6807

[51] Int. Cl.$^5$ .................. G03F 7/039; G03F 7/004
[52] U.S. Cl. ........................... 430/270; 560/80;
560/81; 560/85; 560/100; 560/106; 430/326
[58] Field of Search .................. 430/270; 560/80, 81, 560/85, 100, 106

[56] References Cited

U.S. PATENT DOCUMENTS 3,996,244 12/1976 Fujimoto et al. .................. 560/81 X
4,046,799 9/1977 Kameswaran et al. .......... 560/100 X

FOREIGN PATENT DOCUMENTS 60-03625 1/1985 Japan ................................. 430/270

*Primary Examiner*—Cynthia Hamilton
*Attorney, Agent, or Firm*—Sughrue, Mion, Zinn, Macpeak & Seas

[57] ABSTRACT

A photosensitive composition containing a compound having a group represented by formula (I) or (II), said group, when irradiated with actinic radiation, forming a carboxylic acid or a sulfonic acid:

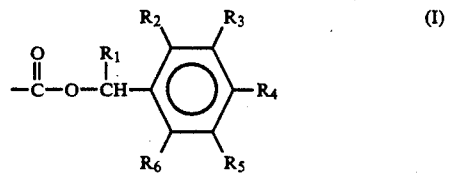

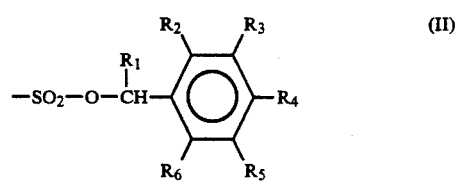

where
$R_1$ represents hydrogen, an alkyl group, or an aryl group; and
$R_2$ to $R_6$ may be the same or different and each represents hydrogen, a halogen, an alkoxyl group, an aryloxyl group, cyano group, or an alkyl group, provided that at least one of $R_2$ to $R_6$ represents an alkoxyl or aryloxyl group and two of $R_2$ to $R_6$ may link to form a ring.

5 Claims, No Drawings

PHOTOSENSITIVE COMPOSITION

FIELD OF THE INVENTION

The present invention relates to a positive-type photosensitive composition which can form fine resist patterns when used for producing lithographic plates, proof sheets for multicolor printing, drawings for use in overhead projectors, and semiconductor integrated circuits.

BACKGROUND OF THE INVENTION

Conventionally known as so-called positive-acting photosensitive materials, which become soluble upon exposure to actinic radiation when used in the production of lithographic plates, etc., are orthoquinone diazide compounds. This type of compounds have actually been used extensively in lithographic plate production and other applications. Examples of such orthoquinone diazide compounds are disclosed in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, and 3,647,443 and many other publications.

Use of these orthoquinone diazide compounds takes advantage of their property that when irradiated with actinic radiation, the compounds decompose to form five-membered-ring carboxylic acids and become soluble in alkaline solutions. However, there have been problems that the photodecomposition yields a nitrogen gas and this causes lifting of the original which was in intimate contact with the photosensitive layer, resulting in print blurring, and that the undecomposed orthoquinone diazide compound causes a coupling reaction during development.

On the other hand, for forming resist patterns for use in producing electronic devices such as semiconductor elements, magnetic-bubble memories, integrated circuits, etc., photoresists having sensitivity to ultraviolet or visible light have conventionally been put to practical use extensively. Photoresists are categorized into two types, negative and positive; negative photoresists are those in which the portions exposed to light become insoluble in developing solutions, whereas positive photoresists are those in which the exposed portions become soluble. Since the negative photoresists are superior in sensitivity to the positive photoresists and are also excellent in the properties required for wet etching, such as adhesion to substrate and chemical resistance, they were mainly used until recently. However, because the widths of the lines constituting resist patterns and the spaces between such lines have been reduced greatly with the recent trend toward higher packing density and higher integration for semiconductor elements and other electronic elements, and because dry etching has come to be used for etching the substrates, photoresists have come to be required to possess high resolution and good resistance to dry etching and, hence, the positive photoresists are presently being employed in most cases. Among the positive photoresists, those of the alkali development type based on alkali-soluble novolac resins are mainly used in the present-day processes because of their excellent sensitivity, resolution, and dry etching resistance. Examples of these alkali development type positive photoresists are described, for example, in J.C. Strieter, Kodak Microelectronics Seminar Proceedings, 116(1976).

However, as electronic devices are becoming increasingly sophisticated and made to have more functions recently, finer resist patterns are strongly desired in order to attain higher packing density and higher integration.

Under the above circumstances, photoresists sensitive to shorter-wavelength radiations are currently being developed, from the photoresists sensitive to g-beam radiation (436 nm) to those sensitive to i-beam radiation (365 nm) and further to those sensitive to deep-UV light (200-300 nm). However, since the orthoquinone diazide compounds used as photosensitive material in the conventional positive photoresists well absorb light in the deep-UV region and have poor photo-bleaching properties in this region, there has been a problem that use of deep-UV light as exposure light results in impaired resist pattern shapes.

In order to eliminate the above problem, several proposals have been made with respect to photosensitive compositions that are positive-acting without using an orthoquinone diazide compound. One of these is to use compounds having a 2-nitrobenzyl ester or 2,6-dinitrobenzyl ester group, as described in, for example, JP-B-56-2696 (the term "JP-B" as used herein means an "examined Japanese patent publication"); U.S. Pat. No. 4,551,416; J. Vac. Sci. Technol., Vol. 19, p. 1338 (1981); and J. Electrochem. Soc., Vol. 129, p. 2552 (1982) and Vol. 130, p. 1433 (1983). Another proposal is to use compounds having a 2-nitrobenzyl sulfonate or 2,6-dinitrobenzyl sulfonate group, as described in, for example, U.S. Pat. No. 4,554,238; Macromolecules, Vol. 21, p. 2001 (1988); and SPIE, Vol. 920, p. 67 (1988). The above-proposed compounds, however, also absorb light in the deep-UV region and do not undergo photobleaching, thus posing the same problem.

Proposed as a method for improving photo-bleaching properties in the deep-UV region is to use compounds having a 2-diazo-1,3-dione

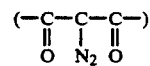

group, as described in, for example, IEEE Trans. Electron Devices, Vol. ED-28, p. 1300 (1981); SPIE, Vol. 771, p. 2 (1987) and Vol. 920, p. 51 (1988); J. Photopolym. Sci. Technol., Vol. 2, p. 392 (1989); U.S. Pat. Nos. 4,522,911, 4,601,969, 4,622,283, 4,624,908, 4,626,491, 4,752,551, 4,808,512 and 4,910,123; and JP-A-63-163340, JP-A-64-33543, JP-A-1-106034, JP-A-1-106035, JP-A-1-106036, JP-A-1-106037, JP-A-1-124849, JP-A-1-152451, and JP-A-1-188852 (the term "JP-A" as used herein means an "unexamined published Japanese patent application"). Although these compounds do show photobleaching properties in the deep-UV region, there are problems that these compounds themselves are apt to sublime during baking and that they are poor in the ability to prevent the unexposed areas from being dissolved by alkaline developing solutions.

Further, as a method for obtaining a positive pattern, use of photoresists employing substituted benzyl ester compounds of various kinds has been proposed in JP-A-1-140144. Such photoresists undergo a decarboxylation reaction upon exposure to light to thereby decrease the ability of the exposed areas not to be dissolved by alkaline developing solutions. The proposed photoresists, however, have a problem that the difference in solubility in alkaline developing solutions between exposed and unexposed areas is not sufficiently large.

SUMMARY OF THE INVENTION

Accordingly, an object of the present invention is to provide a novel positive-type photosensitive composition free of the above-described problems, which composition does not generate any gas during exposure to light and does not cause a coupling reaction during development.

Another object of the present invention is to provide a novel positive-type photosensitive composition which can form good resist patterns through exposure to short-wavelength light, particularly to radiation in the deep-UV region.

The present inventors have conducted intensive studies in order to overcome the above problems. As a result, it has now been found that by use of a novel high molecular weight compound containing an alkoxybenzyl ester group or an alkoxybenzyl sulfonate group, the above-described problems can be eliminated. The present invention has been completed based on this finding.

The above objects of the present invention are accomplished with a photosensitive composition containing a compound having a group represented by formula (I) or (II), said group, when irradiated with actinic radiation, forming a carboxylic acid or a sulfonic acid:

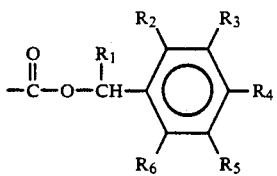

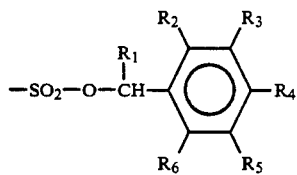

wherein $R_1$ represents hydrogen, an alkyl group, or an aryl group; and $R_2$ to $R_6$ may be the same or different and each represents hydrogen, a halogen, an alkoxyl group, an aryloxyl group, cyano group, or an alkyl group, provided that at least one of $R_2$ to $R_6$ represents an alkoxyl or aryloxyl group and two of $R_2$ to $R_6$ may link to form a ring.

DETAILED DESCRIPTION OF THE INVENTION

The compound having the group represented by formula (I) or (II) is preferably a compound containing at least 1 mol. % of a structural unit derived from a monomer represented by the following formula (III), (IV), (V), or (VI):

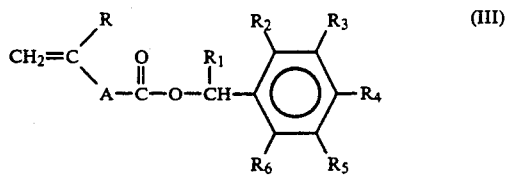

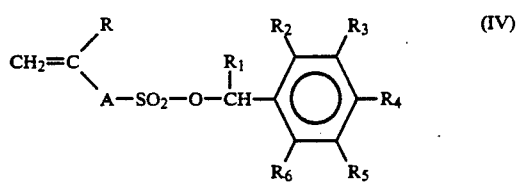

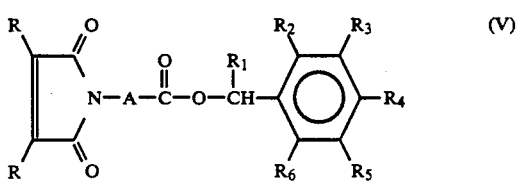

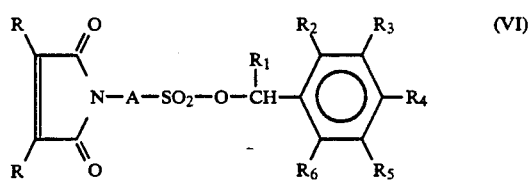

In the above formulae, R represents hydrogen, a halogen, or an alkyl group, preferably hydrogen or an alkyl group having 1 to 4 carbon atoms, more preferably hydrogen or a methyl group. Rs may be the same or different.

$R_1$ represents hydrogen, an alkyl group, or an aryl group, preferably hydrogen or an alkyl group having 1 to 4 carbon atoms.

$R_2$ to $R_6$ may be the same or different and each represents hydrogen, a halogen, an alkoxyl group, an aryloxyl group, cyano group, or an alkyl group, and preferably represents hydrogen, chlorine, an alkoxyl group having 1 to 6 carbon atoms, an aryloxyl group having 6 to 15 carbon atoms, or a straight-chain or branched alkyl group having 1 to 4 carbon atoms, and more preferably represents hydrogen or an alkoxyl group having 1 to 6 carbon atoms, provided that at least one of $R_2$ to $R_6$, preferably at least one of $R_2$ and $R_3$, represents an alkoxyl or aryloxyl group and two of $R_2$ to $R_6$ may be bonded with each other to form a ring.

Specific examples of that moiety of each of the monomers represented by formulae (III) to (VI) which is the monomer's part other than

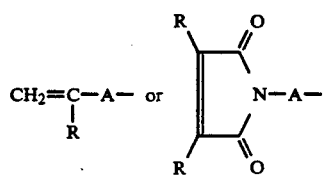

include substituted benzyl ester or sulfonate groups, with examples of such substituted benzyls including 2-alkoxybenzyl, 3-alkoxybenzyl, 2,3-dialkoxybenzyl, 2,4-dialkoxybenzyl, 2,5-dialkoxybenzyl, 2,6-dialkoxybenzyl, 3,4-dialkoxybenzyl, 3,5-dialkoxybenzyl, 2,3,4-trialkoxybenzyl, and 3,4,5-trialkoxybenzyl groups.

In the above formulae (III) to (VI), A represents a single bond or a divalent, aliphatic or aromatic hydrocarbon group. Preferably, A represents a single bond, a divalent aliphatic group having 1 to 30 carbon atoms, or a divalent, monocyclic or polycyclic aromatic group having 6 to 20 carbon atoms. More preferably, A represents a single bond, a divalent aliphatic group having 1 to 10 carbon atoms, or a divalent, monocyclic or polycyclic aromatic group having 6 to 15 carbon atoms.

Further, A may contain therein a ketone, ether, ester, amido, urethane, or ureido group, and may also be bonded with

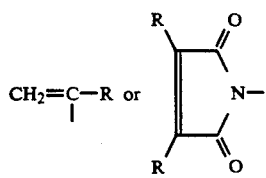

through any of these groups.

The compound containing a structural unit derived from such a monomer of formula (III), (IV), (V), or (VI) has the property of becoming more soluble in an aqueous solution of an alkali with generation of a carboxylic or sulfonic acid when irradiated with actinic rays or radiation.

This compound may be blended with a resin insoluble in water but soluble in an aqueous alkali solution, thereby to give a composition.

In such a case the compound having a group represented by formula (I) or (II) is preferably a compound represented by formula (VII) or (VIII).

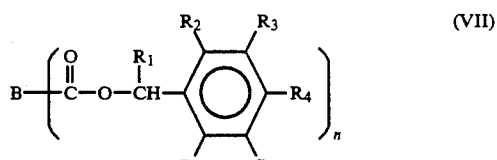

(VII)

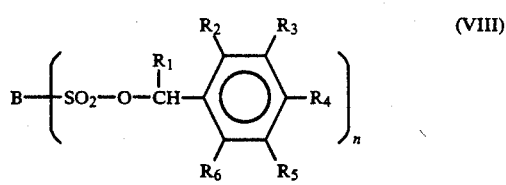

(VIII)

In the above formulae, $R_1$ represents hydrogen, an alkyl group, or an alkyl group preferably hydrogen or an alkyl group having 1 to 4 carbon atoms. $R_2$ to $R_6$ may be the same or different and each represents hydrogen, a halogen, an alkoxyl group, an aryloxyl group, a cyano group, or an alkyl group, and preferably represents hydrogen, chlorine, an alkoxyl group having 1 to 6 carbon atoms, an aryloxyl group having 6 to 15 carbon atoms, or a straight-chain or branched alkyl group having 1 to 4 carbon atoms, and more preferably represents hydrogen or an alkoxyl group having 1 to 6 carbon atoms, provided that at least one of $R_2$ to $R_6$, preferably at least one of $R_2$ and $R_3$, represents an alkoxyl or aryloxyl group and two of $R_2$ to $R_6$ may be bonded with each other to form a ring.

Specific examples of that moiety of the compound represented by formulae (VII) to (VIII) which is the compound's part other than B include substituted benzyl ester or sulfonate groups, with examples of such substituted benzyls including 2-alkoxybenzyl, 3-alkoxybenzyl, 2,3-dialkoxybenzyl, 2,4-dialkoxybenzyl, 2,5-dialkoxybenzyl, 2,6-dialkoxybenzyl, 3,4-dialkoxybenzyl, 3,5-dialkoxybenzyl, 2,3,4-trialkoxybenzyl, and 3,4,5-trialkoxybenzyl groups.

In the above formulae (VII) and (VIII), B represents an aliphatic or aromatic hydrocarbon group having a valency of n. Preferably, B represents an aliphatic group having 1 to 30 carbon atoms, or a monocyclic or polycyclic aromatic group having 6 to 20 carbon atoms, each group having a valency of n. Further, B may contain therein a ketone, ether, ester, amido, urethane, or ureido group, a halogen, or the like. Symbol n represents an integer of 1 or more, preferably an integer of from 1 to 10, and more preferably an integer of from 1 to 5.

The composition of the present invention is described below in detail with regard to its components.

Compound Containing Unit Derived from the Monomer Represented by Formula (III), (IV), (V), or (VI)

The monomer represented by formula (III) or (V) may be synthesized by known methods. For example, it can be obtained by the dehydration condensation reaction of

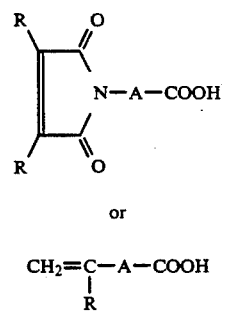

or

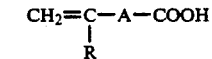

with a compound represented by formula (IX) given below with the aid of a dehydration agent, or by the nucleophilic substitution reaction of the above compounds with a compound represented by formula (X) given below in the presence of a base. Alternatively, the monomer of formula (III) or (V) can be obtained by the dehydrochlorination condensation reaction of

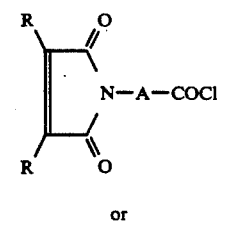

or

with a compound represented by formula (IX) in the presence of a base.

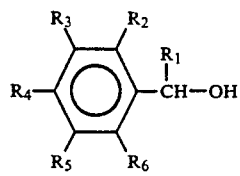 (IX)

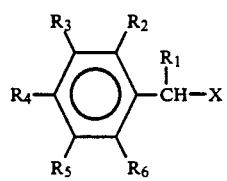 (X)

($R_1$ to $R_6$, R, and a are the same as defined hereinabove with reference to formula (III), and X represents chlorine or bromine.)

The monomer represented by formula (IV) or (VI) may likewise be synthesized by the dehydrochlorination condensation reaction of a compound of formula (IX) with

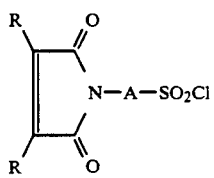

or

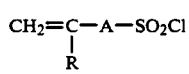

in the presence of a base.

The compound of formula (IX) can be synthesized, for example, by the reductive reaction of a compound of formula (XI) given below with a metal hydride. The compound of formula (X) may be obtained by converting the compound of formula (XI) by the action of a halogenating agent such as phosphorus oxychloride, thionyl chloride, etc.

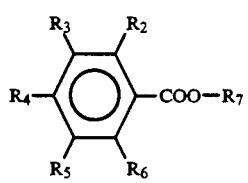 (XI)

($R_2$ to $R_6$ are the same as defined hereinabove with reference to formula (III) or (IV), and $R_7$ represents hydrogen, an alkyl group, or an aryl group.)

The compound employed in the present invention may contain two or more kinds of structural units derived from the monomers represented by formulae (III) to (VI). Specific examples of the monomers represented by formulae (III) to (VI) are given below. In the following examples, R stands for hydrogen or a methyl group.

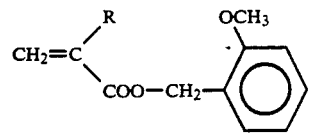 (1)

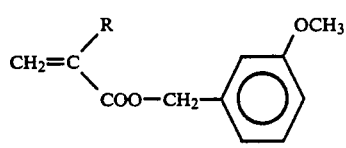 (2)

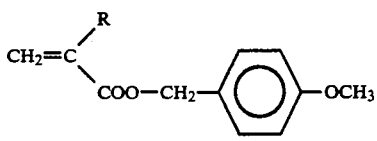 (3)

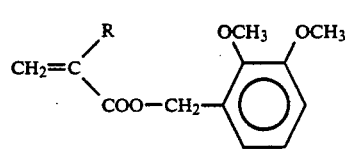 (4)

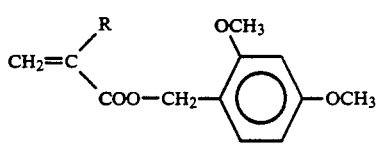 (5)

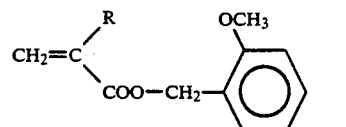 (6)

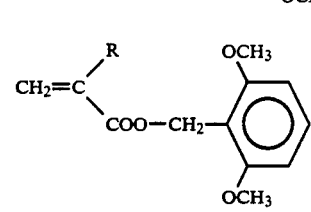 (7)

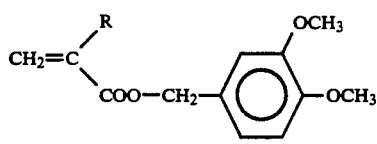 (8)

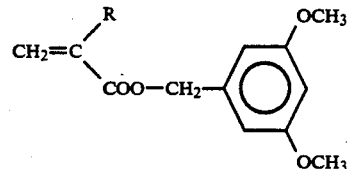 (9)

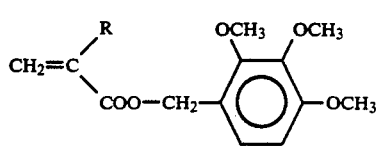 (10)

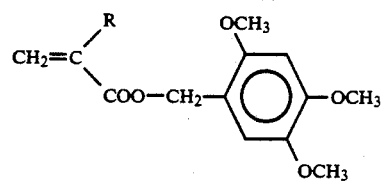 (11)
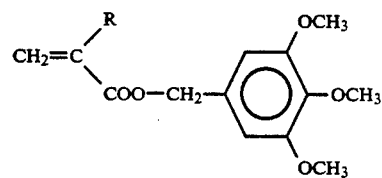 (12)
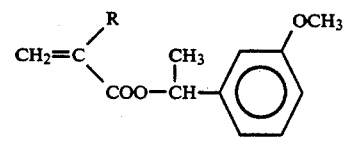 (13)
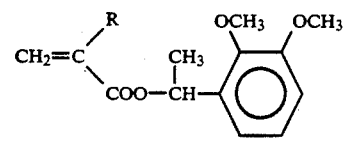 (14)
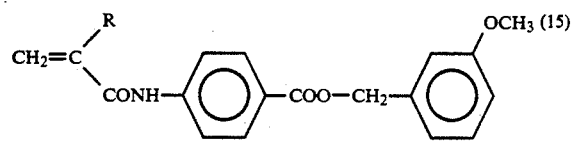 (15)
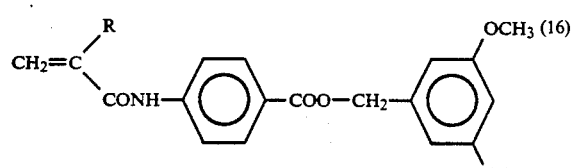 (16)
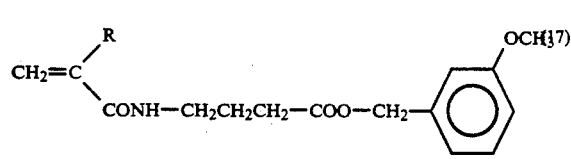 (17)
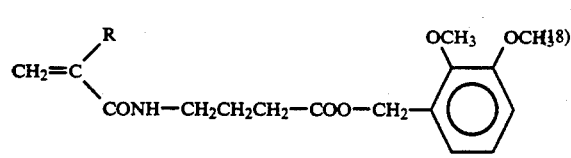 (18)
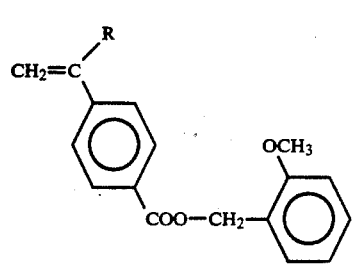 (19)
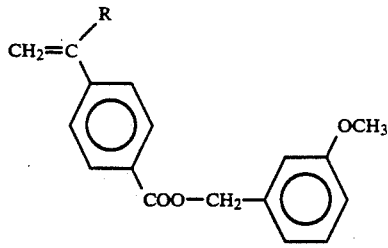 (20)
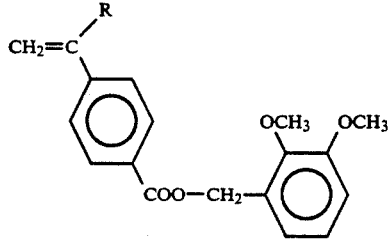 (21)
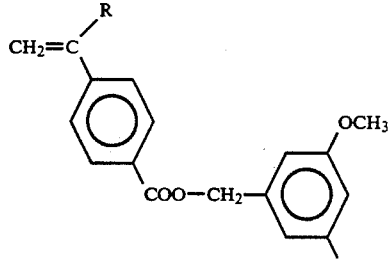 (22)
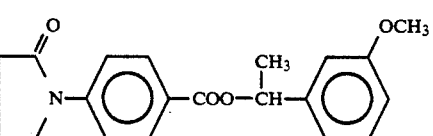 (23)
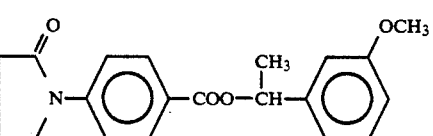 (24)
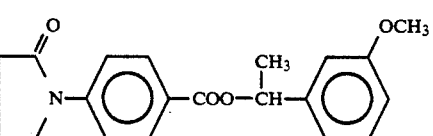 (25)
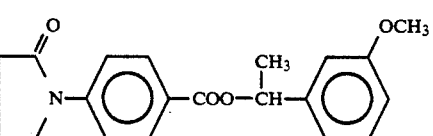 (26)
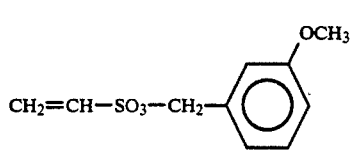 (27)

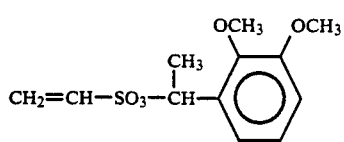 (28)
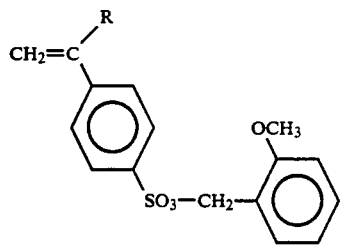 (29)
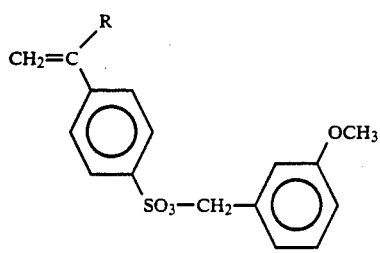 (30)
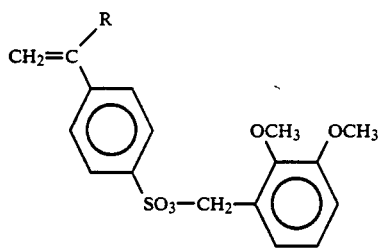 (31)
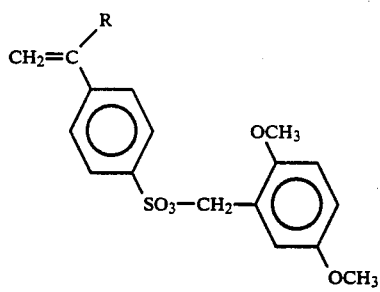 (32)
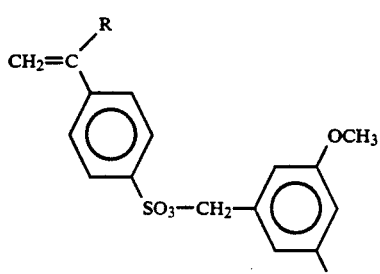 (33)
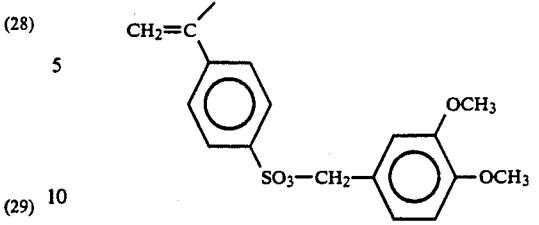 (34)
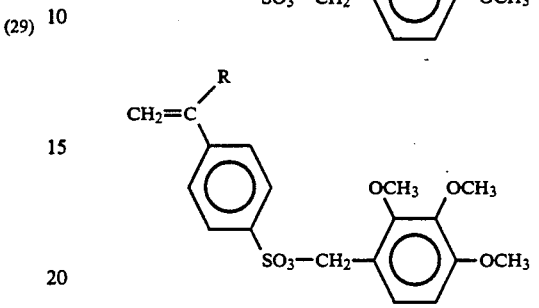 (35)
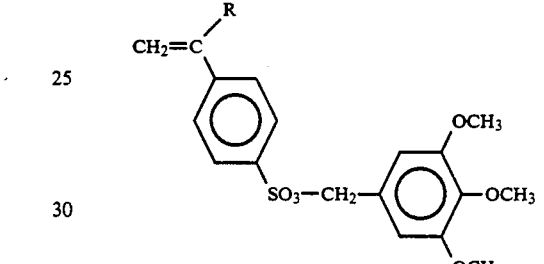 (36)
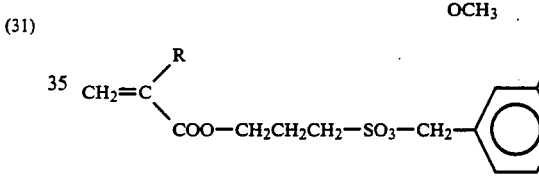 (37)
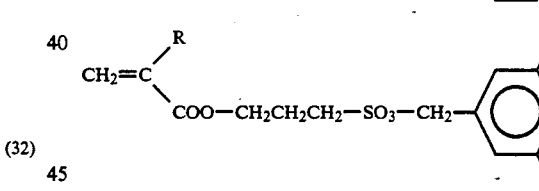 (38)
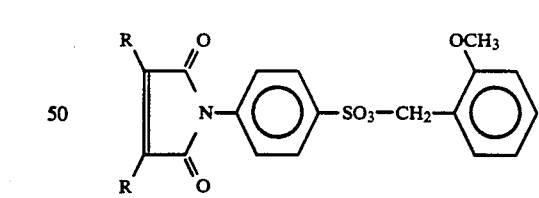 (39)
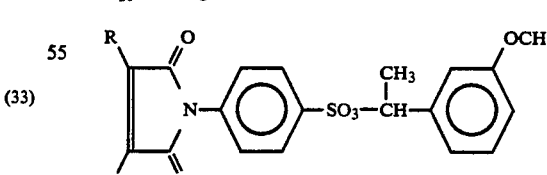 (40)
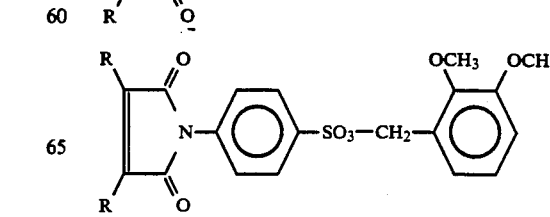 (41)

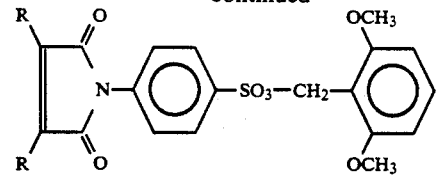

(42)

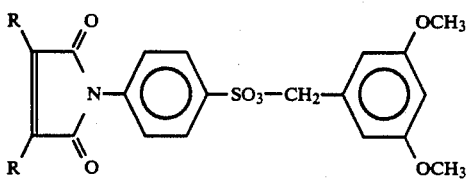

(43)

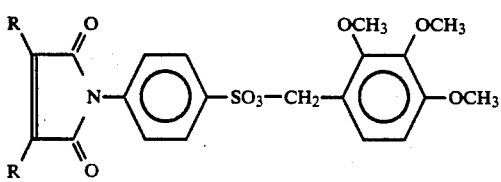

(44)

The compound for use in the composition of this invention may be a copolymer of at least one of the monomers represented by formulae (III) to (VI) with one or more other compounds containing a polymerizable, ethylenically unsaturated bond. In this case, the polymerized amount of the monomers of formulae (III) to (VI) is at least 1 mol. %, preferably 5 mol. % or more, more preferably 10 mol. % or more, based on the total amount of all the monomers polymerized, although it varies depending on the kind of the monomer copolymerized.

Preferred examples of the compound containing a polymerizable, ethylenically unsaturated bond include compounds having one addition-polymerizable unsaturated bond, such as, for example, acrylic acid esters, methacrylic acid esters, acrylamide and its derivatives, methacrylamide and its derivatives, allyl compounds, vinyl ethers, vinyl esters, styrene and its derivatives, crotonic acid esters, and the like.

Specific examples of such copolymerizable compounds are as follows.

Examples of acrylic acid esters include alkyl acrylates with the alkyl group preferably having 1 to 10 carbon atoms (e.g., methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate), aryl acrylates (e.g., phenyl acrylate), and the like.

Examples of methacrylic acid esters include alkyl methacrylates with the alkyl group preferably having 1 to 10 carbon atoms (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofuryl methacrylate), aryl methacrylates (e.g., phenyl methacrylate, cresyl methacrylate, and naphthyl methacrylate), and the like.

Examples of acrylamide and its derivatives include acrylamide, N-alkylacrylamides (the alkyl group may be one having 1 to 10 carbon atoms, such as, for example, methyl, ethyl, propyl, butyl, t-butyl, heptyl, octyl, cyclohexyl, benzyl, or hydroxyethyl), N-arylacrylamides (the aryl group may be phenyl, tolyl, nitrophenyl, naphthyl, cyanophenyl, hydroxyphenyl, or the like), N,N-dialkylacrylamides (the alkyl group may be one having 1 to 10 carbon atoms, such as, for example, methyl, ethyl, butyl, isobutyl, ethylhexyl, or cyclohexyl), N,N-diarylacrylamides (the aryl group may be phenyl or the like), N-methyl-N-phenylacrylamide, N-hydroxyethyl-N-methylacrylamide, N-2-acetamidoethyl-N-acetylacrylamide, and the like.

Examples of methacrylamide and its derivatives include methacrylamide, N-alkylmethacrylamides (the alkyl group may be one having 1 to 10 carbon atoms, such as, for example, methyl, ethyl, t-butyl, ethylhexyl, hydroxyethyl, or cyclohexyl), N-arylmethacrylamides (the aryl group may be phenyl, hydroxyphenyl, or the like), N,N-dialkylmethacrylamides (the alkyl group may be ethyl, propyl, butyl, or the like), N,N-diarylmethacrylamides (the aryl group may be phenyl or the like), N-hydroxyethyl-N-methylmethacrylamide, N-methyl-N-phenylmethacrylamide, N-ethyl-N-phenylmethacrylamide, and the like.

Examples of allyl compounds include allyl esters (e.g., allyl acetate, allyl caproate, allyl caprylate, allyl laurate, allyl palmitate, allyl stearate, allyl benzoate, allyl acetoacetate, and allyl lactate), allyloxyethanol, and the like.

Examples of vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), vinyl aryl ethers (e.g., vinyl phenyl ether, vinyl tolyl ether, vinyl chlorophenyl ether, vinyl 2,4-dichlorophenyl ether, vinyl naphthyl ether, and vinyl anthranyl ether), and the like.

Examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate, and the like.

Examples of styrene and its derivatives include styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxystyrenes (e.g., methoxystyrene, 4-methoxy-3-methylstyrene, and dimethoxystyrene), halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene), and the like.

Examples of crotonic acid esters include alkyl crotonates (e.g., butyl crotonate, hexyl crotonate, and glycerin monocrotonate) and the like.

Specific examples of the compound having a polymerizable, ethylenically unsaturated bond further include dialkyl itaconates such as dimethyl itaconate, diethyl itaconate, dibutyl itaconate, and the like; dialkyl maleates or fumarates such as dimethyl maleate, dibutyl fumarate, and the like; and acrylic acid, methacrylic acid, acrylonitrile, methacrylonitrile, and the like.

In addition to the above examples, other various addition-polymerizable unsaturated compounds that are copolymerizable with the monomers represented by formulae (III) to (VI) given above can generally be used.

The molecular weight of the compound contained in the composition of this invention generally is 1,000 or more, preferably from 5,000 to 1,000,000, in terms of weight-average molecular weight.

In the composition of the present invention, the content of the compound containing a structural unit derived from the monomer represented by formula (III), (IV), (V), or (VI) is generally from 5 to 100% by weight, preferably from 10 to 80% by weight, more preferably from 20 to 60% by weight, based on the total amount of all the solid components of the composition.

Compound Represented by Formula (VII) or (VIII)

The compound represented by formula (VII) may be synthesized by known methods. For example, it can be obtained by the dehydration condensation reaction of a compound represented by formula (IX) given below with a compound of the formula B-(-COOH)$_n$ with the aid of a dehydration agent, by the dehydrochlorination condensation reaction of a compound represented by formula (IX) with a compound of the formula B—COCl)$_n$ in the presence of a base, or by the nucleophilic substitution reaction of a compound represented by formula (X) given below with a compound of the formula B—COOH)$_n$ in the presence of a base.

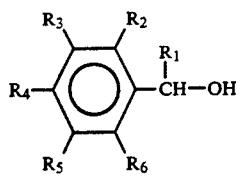

(IX)

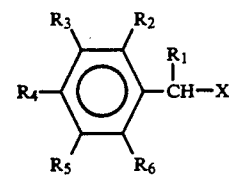

(X)

In the above formulae, $R_1$ to $R_6$, B, and n are the same as defined hereinabove with reference to formula (VII), and X represents chlorine or bromine.

The compound represented by formula (VIII) may likewise be synthesized by the dehydrochlorination condensation reaction of a compound of formula (IX) with a compound of the formula B-(-SO$_2$Cl)$_n$ in the presence of a base.

The compound of formula (IX) can be synthesized, for example, by the reductive reaction of a compound of formula (XI) given below with a metal hydride. The compound of formula (X) may be obtained by converting the compound of formula (IX) by the action of a halogenating agent such as phosphorus oxychloride, thionyl chloride, etc.

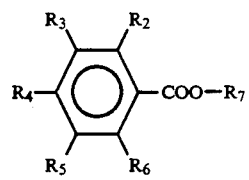

(XI)

In the above formula, $R_2$ to $R_6$ are the same as defined hereinabove with reference to formula (VII) or (VIII), and $R_7$ represents hydrogen, an alkyl group, or an aryl group.

The compound of formula (VII) or (VIII) employed in the present invention serves, when irradiated with actinic rays or radiation, to enhance the solubility of the photosensitive composition in an aqueous solution of an alkali with generation of a carboxylic or sulfonic acid.

Specific examples of the compounds represented by formulae (VII) and (VIII) are given below.

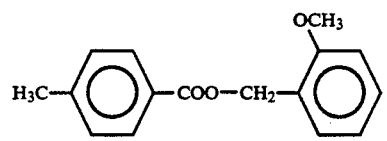

(45)

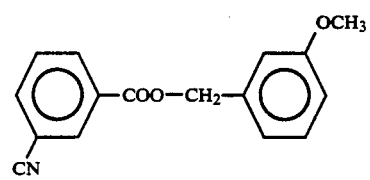

(46)

-continued
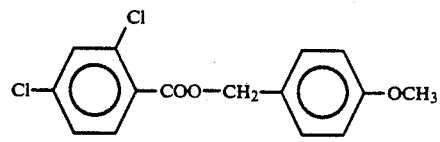 (47)
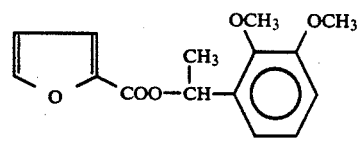 (48)
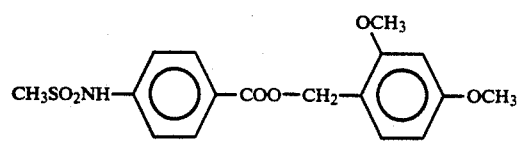 (49)
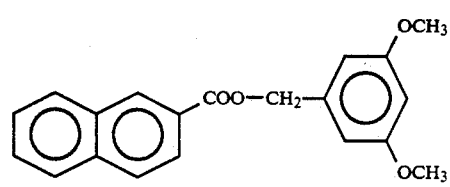 (50)
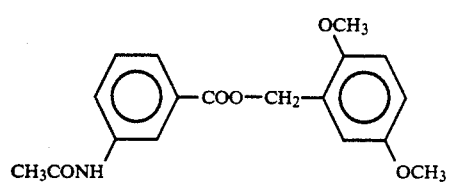 (51)
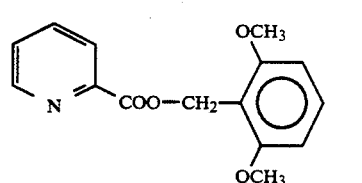 (52)
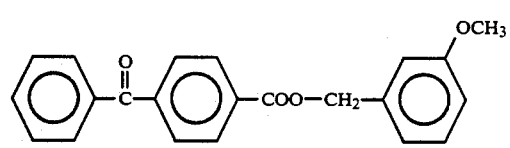 (53)
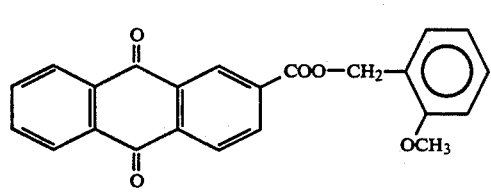 (54)
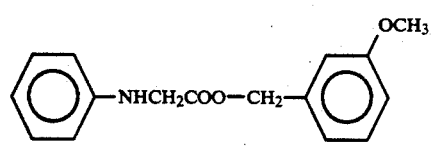 (55)
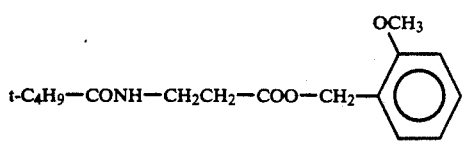 (56)

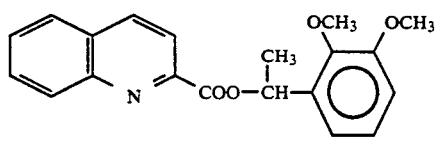
(57)
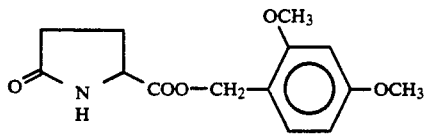
(58)
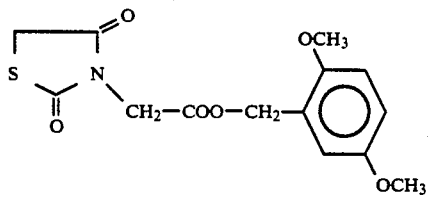
(59)
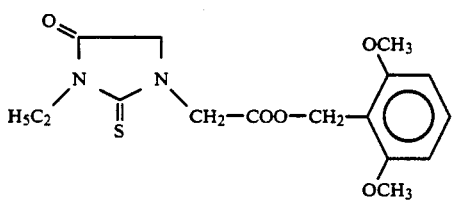
(60)
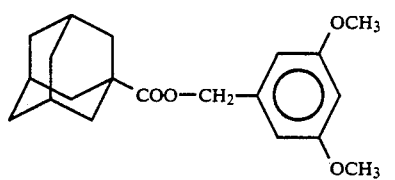
(61)
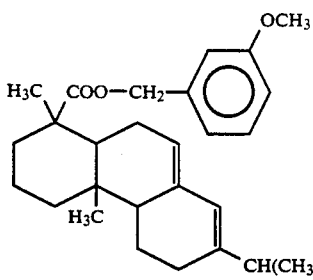
(62)
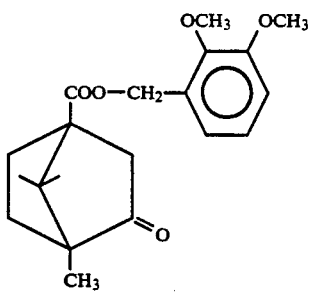
(63)
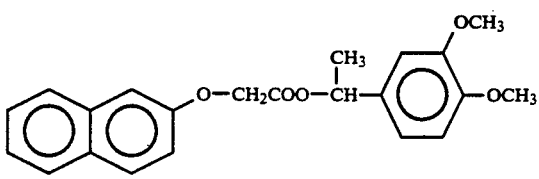
(64)

-continued
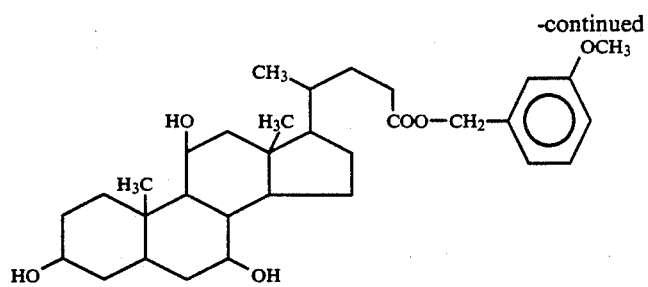 (65)
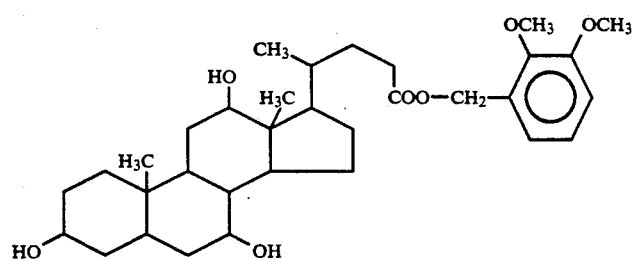 (66)
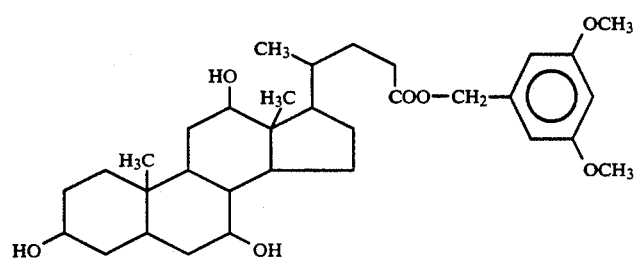 (67)
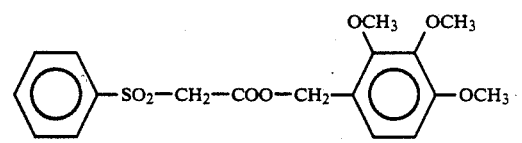 (68)
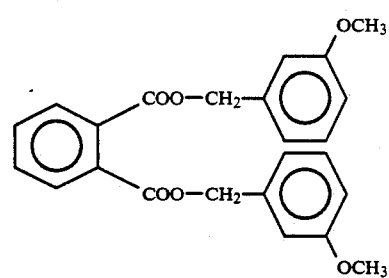 (69)
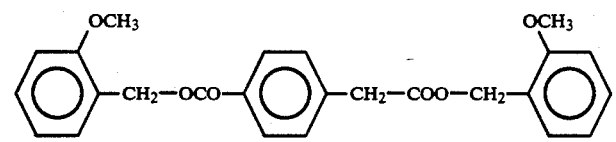 (70)
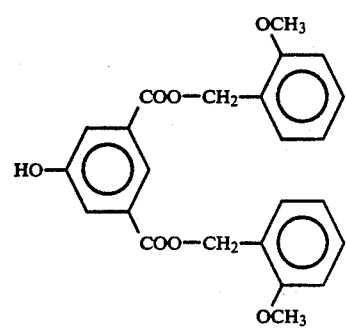 (71)

-continued
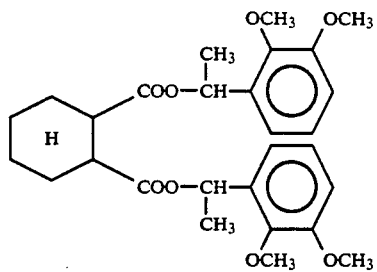 (72)
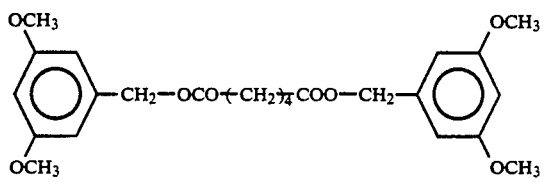 (73)
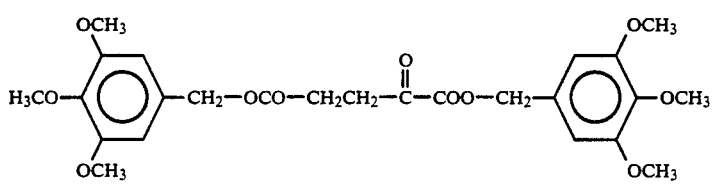 (74)
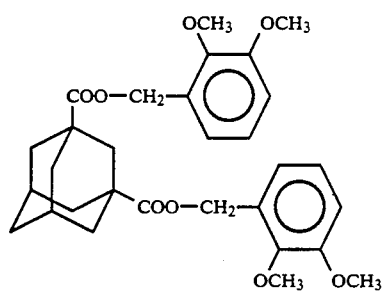 (75)
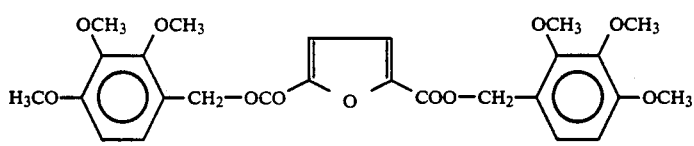 (76)
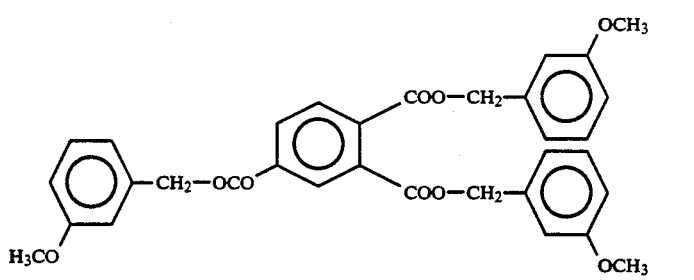 (77)
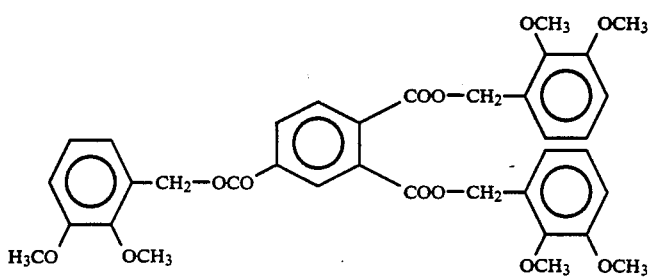 (78)

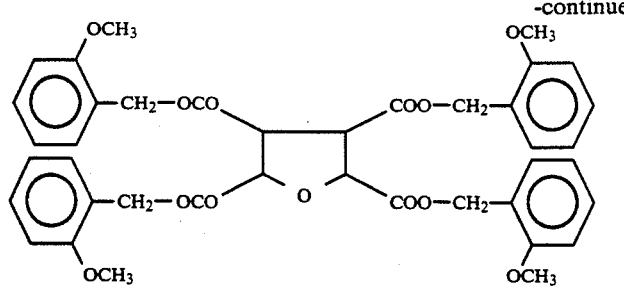(79)
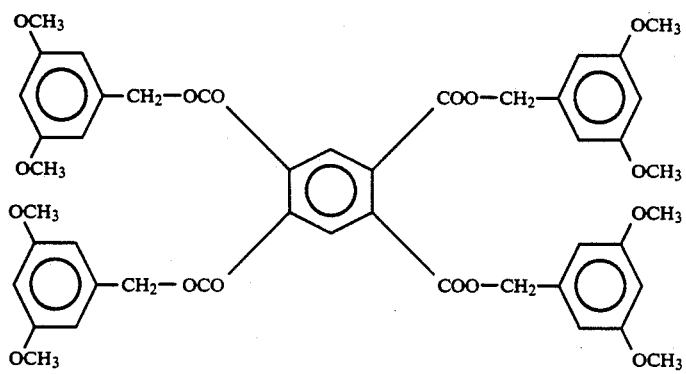(80)
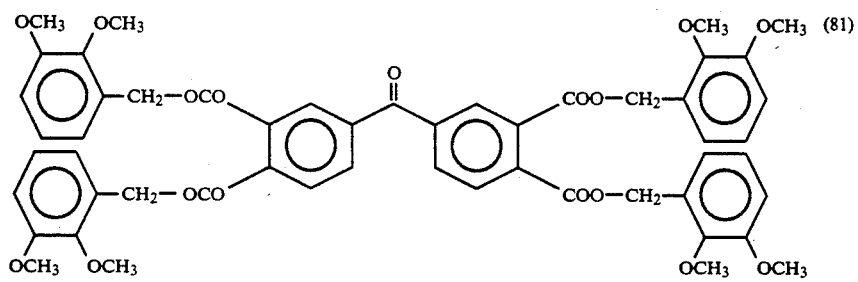(81)
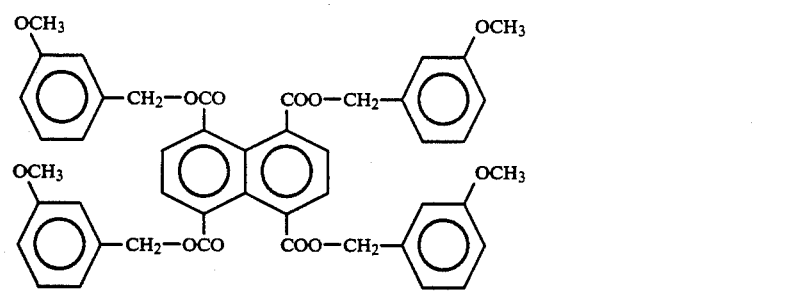(82)
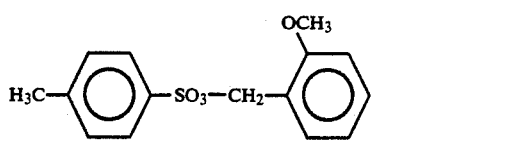(83)
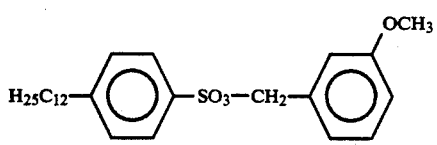(84)
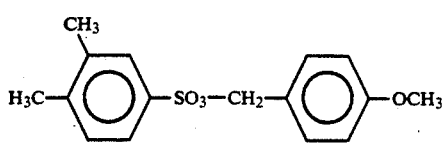(85)

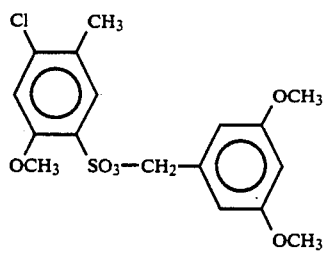 (86)
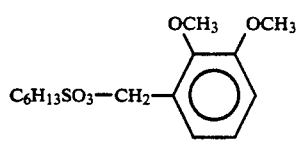 (87)
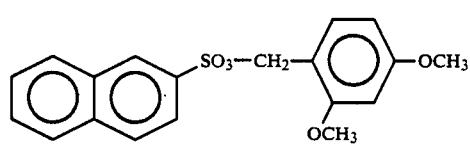 (88)
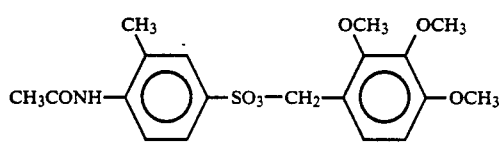 (89)
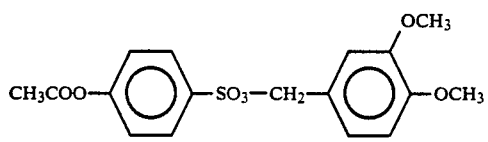 (90)
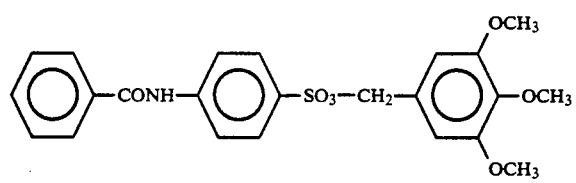 (91)
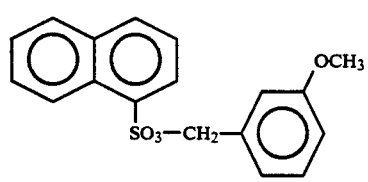 (92)
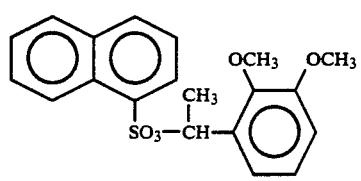 (93)

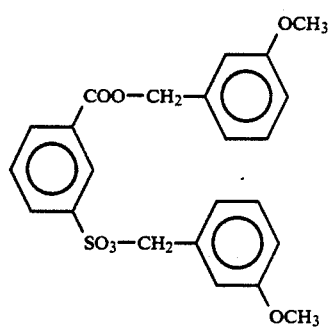
(94)
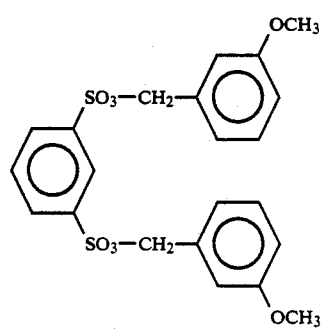
(95)
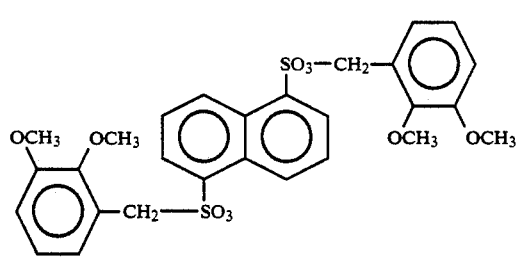
(96)
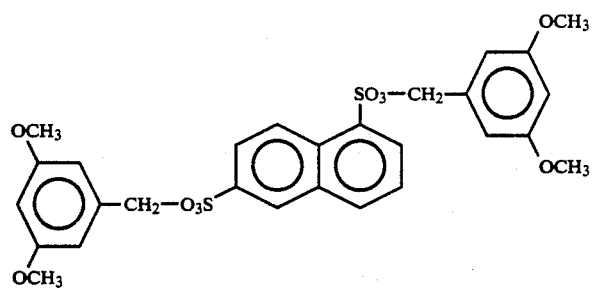
(97)
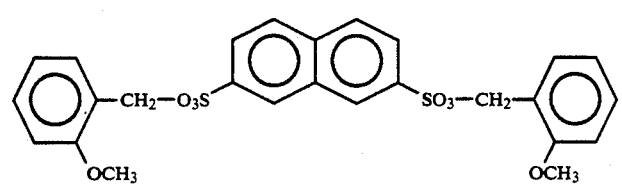
(98)

-continued

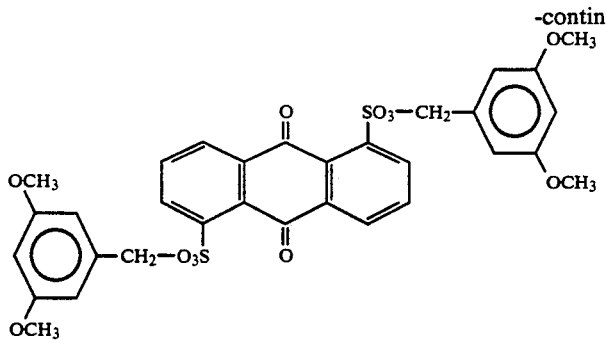
(99)

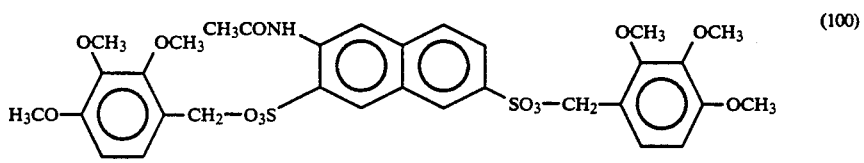
(100)

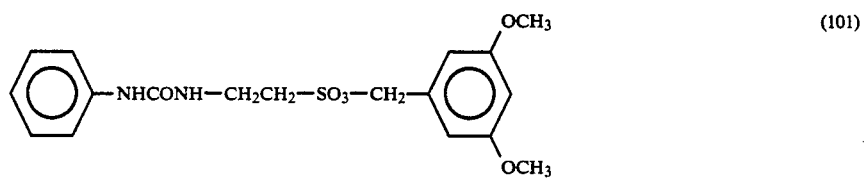
(101)

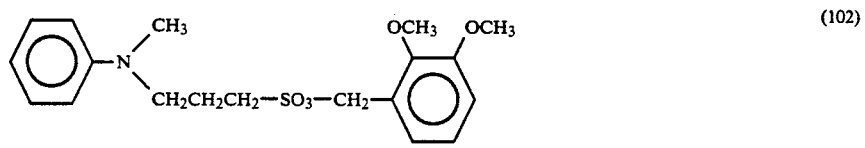
(102)

In the composition of the present invention, the content of the compound represented by formula (VII) or (VIII) is generally from 5 to 95% by weight, preferably from 10 to 80% by weight, more preferably from 20 to 60% by weight, based on the total amount of all the solid components of the composition.

Alkali-Soluble Resin

Into the positive-type photosensitive composition of the present invention, an alkali-soluble resin may be further incorporated for the purpose of enhancing the solubility of exposed areas in alkali solutions and imparting good film properties and heat resistance to the resulting resists.

Such an alkali-soluble polymer preferably is a polymer having a pKa value of 11 or less and containing an acid hydrogen atom-containing group such as a phenolic hydroxyl group, carboxyl group, sulfonic group, imido group, sulfonamido group, N-sulfonylamido group, N-sulfonylurethane group, active methylene group, or the like. Preferred examples of the alkali-soluble polymer are novolac phenolic resins. Specific examples thereof include phenol-formaldehyde resins, o-cresol-formaldehyde resins, m-cresol-formaldehyde resins, p-cresol-formaldehyde resins, xylenol-formaldehyde resins, and co-condensation products obtained from these monomers. As disclosed in U.S. Pat. No. 4,123,279, such a phenolic resin may be used in combination with a condensate obtained from phenol or cresol substituted with an alkyl group having 3 to 8 carbon atoms and formaldehyde, such as a t-butylphenolformaldehyde resin. Further, copolymers of a phenolic hydroxyl group-containing monomer such as N-(4-hydroxyphenyl)methacrylamide, homopolymers or copolymers of p-hydroxystyrene, o-hydroxystyrene, m-isopropenylphenol, p-isopropenylphenol, or the like, and polymers obtained by partial etherification or partial esterification of the above polymers may be used.

Preferred examples of the alkali-soluble polymer further include a copolymer of a carboxyl group-containing monomer such as acrylic acid, methacrylic acid, or the like, a polymer obtained by hydrolysis of a copolymer of maleic anhydride and styrene etc. or by half-esterification of the copolymer with an alcohol, carboxyl group-containing poly(vinyl acetal) resins described in JP-A-61-267042, and carboxyl group-containing polyurethane resins described in U.S. Pat. No. 4,898,803.

Examples of the alkali-soluble polymer furthermore include copolymers of N-(4-sulfamoylphenyl)methacrylamide, N-phenylsulfonylmethacrylamide, or maleimide and polymers containing an active methylene group as described in JP-A-63-127237.

Although these alkali-soluble polymers may be used alone, two or more thereof may be used in combination. The amount of the alkali-soluble polymer incorporated into the photosensitive composition is preferably from 5 to 95% by weight, more preferably from 20 to 90% by weight, most preferably from 40 to 80% by weight, based on the total amount of all the solid components of the composition.

Other Preferred Ingredients

If desired, dyes, pigments, plasticizers, compounds that increase photodecomposition efficiency (so-called sensitizers), and the like may further be incorporated into the positive-type photosensitive composition of the present invention.

Preferred examples of dyes, which may be used as colorants, include oil-soluble dyes and basic dyes. Specific examples thereof include Oil Yellow #101, Oil Yellow #130, Oil Pink #312, Oil Green BG, Oil Blue BOS, Oil Blue #603, Oil Black BY, Oil Black BS, Oil Black T-505 (the above being manufactured by Orient Chemical Industries Ltd., Japan), Crystal Violet (CI42555), Methyl Violet (CI42535), Rhodamine B (CI45170B), Malachite Green (CI42000), Methylene Blue (CI52015), and the like.

A printing-out agent may also be added for obtaining a visible image immediately after exposure to light. A representative example of this printing-out agent may be a combination of a photosensitive compound which releases an acid upon exposure to light and an organic dye which can form a salt with the acid. Specific examples thereof include combinations of o-naphthoquinonediazido-4-sulfonic acid halogenides and salt-forming organic dyes as described in U.S. Pat. No. 3,969,118 and JP-A-53-8128, and combinations of trihalomethyl compounds and salt-forming organic dyes as described in U.S. Pat. Nos. 4,160,671, 4,212,970 and 4,232,106.

For the purpose of further improving sensitivity, a cyclic acid anhydride and a filler or the like may be added to the composition of the present invention. Examples of the cyclic acid anhydride include, as described in U.S. Pat. No. 4,115,128, phthalic anhydride, tetrahydrophthalic anhydride, hexahydrophthalic anhydride, 3,6-endoxo-$\Delta^4$-tetrahydrophthalic anhydride, tetrachlorophthalic anhydride, maleic anhydride, chloromaleic anhydride, α-phenylmaleic anhydride, succinic anhydride, pyromellitic acid, and the like. By incorporating such a cyclic acid anhydride into the composition of the present invention in an amount of from 1 to 15% by weight based on the total amount of all the solid components of the composition, the sensitivity of the composition can be heightened up to about three times.

Solvent

In the case where the positive-type photo-sensitive composition of the present invention is for use as a material for producing lithographic plates, the composition is dissolved in a solvent which can dissolve all the above-described ingredients, and then applied on a substrate. For use as a resist material for producing semiconductors etc., the composition of this invention is used in the form of a solution in a solvent. Examples of solvents that can be used include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-bulyrolactone, toluene, ethyl acetate, and the like. These solvents may be used alone or as a mixture of two or more thereof. The total content of the solid components including additives in the composition is generally from 2 to 50% by weight. In the case where the composition is to be coated on a substrate, the spread rate varies depending on use of the coating. However, in the case where the photo-sensitive composition is used for producing lithographic plates, for example, the preferred spread rate is generally from 0.5 to 3.0 g/m$^2$ on a dry basis. As spread rate decreases, photosensitivity is enhanced but the properties of the exposed film are impaired.

Preparation of Lithographic Plate

In the case of preparing a lithographic plate by use of the positive-type photosensitive composition of the present invention, the composition is applied on a substrate. Examples of the substrate include papers; papers laminated with plastics (polyethylene, polypropylene, polystyrene, etc.); plates of metals such as aluminum (including aluminum alloys), zinc, copper, etc.; films of plastics such as cellulose diacetate, cellulose triacetate, cellulose propionate, cellulose butyrate, cellulose acetate butyrate, cellulose nitrate, poly(ethylene terephthalate), polyethylene, polystyrene, polypropylene, polycarbonates, poly(vinyl acetal)s, and the like; and papers, plastic films, or the like on which the above metals have been laminated or deposited. Of these substrates, aluminum plate is particularly preferred because it is extremely dimensionally stable and inexpensive. Also preferred is a composite sheet obtained by cladding an aluminum sheet to a poly(ethylene terephthalate) film, as described in JP-B-48-18327. The surface of the aluminum plate is roughened by mechanical means such as wire brush graining, brush graining in which the surface is roughened with a nylon brush while a slurry of abrasive particles is being poured thereon, ball graining, graining by solution honing, buff graining, or the like, by chemical graining employing an etchant such as HF, AlCl$_3$, or HCl, by electrolytic graining using nitric acid or hydrochloric acid as the electrolyte, or by a graining method which is a combination of two or more of these surface-roughening techniques. If desired, the grained surface is then subjected to etching treatment with an acid or an alkali and, preferably, the etched surface is subsequently anodized in sulfuric acid, phosphoric acid, oxalic acid, boric acid, chromic acid, sulfamic acid, or a mixed acid consisting of two or more of these acids by means of direct or alternating electric current, thereby forming a tenacious passive-state film on the aluminum surface. Although the resulting aluminum plate surface has a hydrophilic nature because such a passive-state film itself is hydrophilic, the anodized aluminum surface may, if desired, further be made more hydrophilic by various treatments such as treatment with a silicate (sodium silicate, potassium silicate) as described in U.S. Pat. Nos. 2,714,066 and 3,181,461, treatment with potassium fluorozirconate as described in U.S. Pat. No. 2,946,638, treatment with a phosphomolybdate as described in U.S. Pat. No. 3,201,247, treatment with an alkyl titanate as described in U.K. Patent 1,108,559, treatment with poly(acrylic acid) as described in West German Patent 1,091,433, treatment with poly(vinylsulfonic acid) as described in West German Patent 1,134,093 and U.K. Patent 1,230,447, treatment with phosphoric acid as described in JP-B-44-6409, treatment with phytic acid as described in U.S. Pat. No. 3,307,951, treatment with a combination of a hydrophilic organic polymer and a divalent metal as described in U.S. Pat. No. 4,427,765 and JP-A-58-18291, and application of a primer comprising a water-soluble polymer containing a sulfonic group as described in U.S. Pat. No. 4,578,342. The thus-treated aluminum plate is especially preferred. Other treatments for hydrophilizing include silicate electrodeposition as described in U.S. Pat. No. 3,658,662.

Also preferred as the substrate is an aluminum plate which has undergone graining and anodizing, followed by pore-sealing treatment. Such a pore-sealing treatment can be performed by immersion in hot water and in a hot water solution containing an inorganic or organic salt and by means of a steam bath etc.

Actinic Rays or Radiation

Examples of the light source for emitting actinic rays which can be used for irradiating the composition of this invention include a mercury lamp, metal halide lamp, xenon lamp, chemical lamp, carbon-arc lamp, and the like. Examples of radiation include electron beam, X-rays, ion beam, far ultraviolet rays, and the like. Preferred examples of the radiation with which the photoresist according to the present invention is irradiated are g-beam, i-beam, and deep-UV radiation. Further, scanning with a high-energy-density beam (laser beam or electron beam) or exposure to a pulsed beam of the same kind may also be used for irradiating the photoresist. Examples of the laser beam include helium-neon laser beam, argon laser beam, krypton ion laser beam, helium-cadmium laser beam, KrF excimer laser beam, and the like.

Developing Solution

Preferred examples of developing solutions for the positive-type photosensitive composition of this invention include aqueous solutions of inorganic alkalis such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, ammonia, and the like, and aqueous solutions of organic alkalis such as tetraalkylammonium hydroxides. The developing solution contains such an alkali at a concentration of from 0.1 to 10% by weight, preferably from 0.5 to 5% by weight.

If desired, a surfactant and an organic solvent such as an alcohol may be added to the aqueous alkaline solution.

The present invention will be explained below in more detail by reference to the following Synthesis Examples and Examples, which should not be construed to be limiting the scope of the invention.

SYNTHESIS EXAMPLE 1

Synthesis of 3,5-dimethoxybenzyl alcohol

In 100 ml of dehydrated THF was dispersed 7.6 g of lithium aluminum hydride (LiAlH$_4$). To this dispersion was added dropwise with stirring a solution of 36.4 g of 3,5-dimethoxybenzoic acid in 200 ml of dehydrated THF over a period of 1 hour. Thereafter, stirring of the mixture was continued at room temperature for 1 hour, and 20 ml of water was then added dropwise to treat the LiAlH$_4$ remaining unreacted. This reaction mixture was then poured into 1.5 liters of water, and the resulting mixture was acidified by adding thereto 20 g of concentrated hydrochloric acid and then subjected twice to extraction with 700 ml of ethyl acetate. The extract was washed with water and then dried over anhydrous magnesium sulfate. The thus-dried ethyl acetate solution was concentrated and the reaction product was purified by column chromatography (column packing: silica gel, developer: hexane/ethyl acetate=2/1), thereby obtaining 31 g of colorless acicular crystals. Upon NMR analysis, the crystals were ascertained to be 3,5-dimethoxybenzyl alcohol of the following formula.

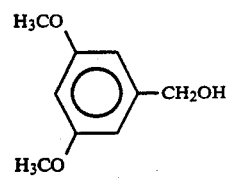

SYNTHESIS EXAMPLE 2

Synthesis of 3,5-dimethoxybenzyl methacrylate

In 120 ml of acetone were dissolved 16.8 g (0.100 mol) of 3,5-dimethoxybenzyl alcohol, 9.5 g (0.094 mol) of triethylamine, and 1.3 g (0.011 mol) of 4-(dimethylamino)pyridine. To this solution was added dropwise at room temperature a solution of 11.0 g (0.105 mol) of methacryloyl chloride in 50 ml of acetone over a period of 30 minutes. The resulting mixture was then kept being stirred for 1 hour. The resulting salt solution was filtered and was concentrated, and the reaction product was then purified by column chromatography (column packing: silica gel, developer: hexane/ethyl acetate=5/1). Thus, 17.5 g of an oily liquid was obtained.

Upon NMR analysis, this liquid was ascertained to be 3,5-dimethoxybenzyl methacrylate of the following formula.

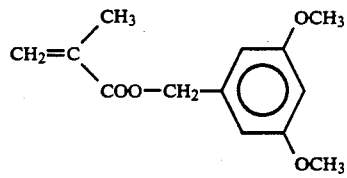

SYNTHESIS EXAMPLE 3

Synthesis of 4-chlorosulfonylstyrene

In 400 ml of CHCl$_3$ was dispersed 82.5 g of sodium 4-styrenesulfonate. To this dispersion was gradually added, with stirring and ice-cooling, 124.9 g of phosphorus pentachloride. The resulting mixture was then heated with refluxing for 5 hours. After the reaction mixture was allowed to cool, it was poured into 600 ml of ice water, and the CHCl$_3$ layer was washed with water, dried with anhydrous magnesium sulfate, and then concentrated. The reaction product was then purified by vacuum distillation, thereby obtaining 45 g of an oily liquid. Upon NMR and elementary analysis, this liquid was ascertained to be 4-chlorosulfonylstyrene of the following formula.

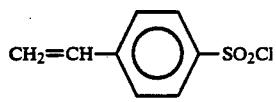

SYNTHESIS EXAMPLE 4

Synthesis of 3,5-dimethoxybenzyl 4-styrenesulfonate

Reaction and post-treatments were conducted in the same manner as in Synthesis Example 2 except that 21.3 g (0.105 mol) of 4-chlorosulfonylstyrene was used in place of methacryloyl chloride used in Synthesis Example 2. Thus, 25.2 g of a viscous oily liquid was obtained. Upon NMR analysis, this liquid was ascertained to be 3,5-dimethoxybenzyl 4-styrenesulfonate of the following formula.

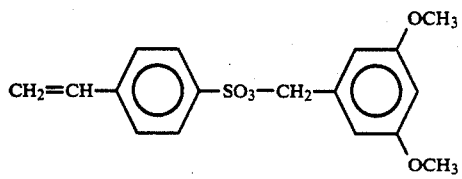

SYNTHESIS EXAMPLE 5

Synthesis of 3,5-dimethoxybenzyl methacrylate polymer

In 80 ml of 2-methoxyethanol was dissolved 23.6 g of 3,5-dimethoxybenzyl methacrylate. In a nitrogen stream, the above solution was heated to 65° C. and 0.025 g of 2,2'-azobis(2,4-dimethylvaleronitrile) was added. The resulting mixture was heated with stirring for 3 hours. Subsequently, 0.025 g of 2,2'-azobis(2,4-dimethylvaleronitrile) was added again, and the reaction was allowed to proceed further for 4 hours.

The reaction mixture was poured into 2 liters of water with stirring, and the resulting white resin precipitate was filtered off and dried, thereby obtaining 22 g of a polymer. The molecular weight of this polymer was measured by gel permeation chromatography (GPC) and was found to be 55,000 in terms of weight-average molecular weight of polystyrene.

SYNTHESIS EXAMPLE 6

Synthesis of 3,5-dimethoxybenzyl 4-styrenesulfonate/styrene copolymer

Reaction and post-treatments were conducted in the same manner as in Synthesis Example 5 except that 20.1 g (0.060 mol) of 3,5-dimethoxybenzyl 4-styrenesulfonate and 4.2 g (0.040 mol) of styrene were used in place of 3,5-dimethoxybenzyl methacrylate used in Synthesis Example 5. Thus, 23 g of a white resin was obtained. The molecular weight of this resin was measured by GPC and was found to be 43,000 in terms of weight-average molecular weight of polystyrene.

SYNTHESIS EXAMPLE 7

Synthesis of Compound (50)

In 120 ml of acetone were dissolved 16.8 g (0.100 mol) of 3,5-dimethoxybenzyl alcohol, 9.5 g (0.094 mol) of triethylamine, and 1.3 g (0.011 mol) of 4-(dimethylamino)pyridine. To this solution was added dropwise at room temperature a solution of 20.0 g (0.105 mol) of 2-naphthyloyl chloride in 50 ml of acetone over a period of 30 minutes. The resulting mixture was then kept being stirred for 1 hour. The salt solution formed was filtered, concentrated, and then purified by column chromatography (column packing: silica gel, developer: hexane/ethyl acetate=5/1). Thus, 21.5 g of colorless crystals were obtained.

Upon NMR analysis, the crystals were ascertained to be Compound (50).

SYNTHESIS EXAMPLE 8

Synthesis of Compound (69)

In 120 ml of acetone were dissolved 13.8 g (0.100 mol) of 3-methoxybenzyl alcohol, 9.5 g (0.094 mol) of triethylamine, and 1.3 g (0.011 mol) of 4-(dimethylamino)pyridine. To this solution was added dropwise at room temperature a solution of 10.6 g (0.052 mol) of phthaloyl chloride in 50 ml of acetone over a period of 30 minutes. The resulting mixture was then kept being stirred for 1 hour. The salt solution formed was filtered, concentrated, and then purified in the same manner as in Synthesis Example 7. Thus, 13.5 g of colorless crystals were obtained.

Upon NMR analysis, the crystals were ascertained to be Compound (69).

SYNTHESIS EXAMPLE 9

Synthesis of Compound (96)

In 120 ml of acetone were dissolved 16.8 g (0.100 mol) of 2,3-dimethoxybenzyl alcohol, 9.5 g (0.094 mol) of triethylamine, and 1.3 g (0.011 mol) of 4-(dimethylamino)pyridine. To this solution was added dropwise at room temperature a solution of 17.0 g (0.052 mol) of 1,5-bis(chlorosulfonyl)naphthalene in 50 ml of acetone over a period of 30 minutes. The resulting mixture was then kept being stirred for 1 hour. The salt solution formed was filtered, concentrated, and then purified in the same manner as in Synthesis Example 2. Thus, 12.8 g of colorless crystals were obtained.

Upon NMR analysis, the crystals were ascertained to be Compound (96).

EXAMPLES 1 TO 6

Six kinds of photosensitive liquids [A]-1 to [A]-6 shown in Table 1 were prepared according to the formulation for photosensitive liquid [A] given below, with the kind of the compound in the formulation being varied as specified in the table.

| Formulation for photosensitive liquid [A] | |
| --- | --- |
| Compound according to the invention | 1.0 g |
| Ethyl cellosolve acetate | 7.0 g |

Each photosensitive liquid was coated on a silicon wafer by means of a spinner, and then dried on a hot plate at 90° C. for 2 minutes. The film thickness was 1.0 μm.

Subsequently, the photoresist was brought into contact with a mask and exposed through the mask to 254-nm light taken out through a filter. The resulting photoresist was developed with a 2.4% aqueous solution of tetramethylammonium hydroxide for 60 seconds. As a result, a good resist pattern with 0.5-μm lines and spaces was obtained.

The molecular weights of the compounds shown in Table 1 according to the present invention were from 42,000 to 68,000 in terms of weight-average molecular weight of polystyrene as measured by GPC.

TABLE 1

| | | Compounds for photosensitive liquids [A] |
|---|---|---|
| Example No. | Photosensitive liquid | Structural monomer unit ratio (by mol) in the compound |
| 1 | [A]-1 | Compound (2) (R = CH$_3$)/ benzyl methacrylate (70/30) |
| 2 | [A]-2 | Compound (9) (R = CH$_3$)/ benzyl methacrylate (70/30) |
| 3 | [A]-3 | Compound (16) (R = =CH$_3$)/ benzyl methacrylate (70/30) |
| 4 | [A]-4 | Compound (21) (R = H)/styrene (60/40) |
| 5 | [A]-5 | Compound (25) (R = H)/styrene (60/40) |
| 6 | [A]-6 | Compound (35) (R = H)/styrene (60/40) |

EXAMPLES 7 TO 12

Six kinds of photosensitive liquids [B]-1 to [B]-6 shown in Table 2 were prepared according to the formulation for photosensitive liquid [B] given below, with the kind of compound in the formulation being varied as specified in the table.

| Formulation for photosensitive liquid [B] | |
|---|---|
| Compound according to the invention | 0.5 g |
| Poly(p-hydroxystyrene) (manufactured by Maruzene Petrochemical Co., Ltd., Japan; weight-average molecular weight 6,000) | 1.0 g |
| Ethyl cellosolve acetate | 8.5 g |

Each photosensitive liquid was coated on a silicon wafer by means of a spinner, and then dried on a hot plate at 90° C. for 2 minutes. The film thickness was 1.0 μm.

Subsequently, the photoresist was exposed through a mask to a pulsed, 249-nm KrF excimer laser beam, and then developed with a 2.4% aqueous solution of tetramethylammonium hydroxide for 60 seconds. As a result, a good resist pattern with 0.3-μm lines and spaces was obtained.

The molecular weights of the compounds shown in Table 2 according to the present invention were from 43,000 to 65,000 in terms of weight-average molecular weight of polystyrene as measured by GPC.

TABLE 2

| | | Compounds for photosensitive liquids [B] |
|---|---|---|
| Example No. | Photosensitive liquid | Structural monomer unit ratio (by mol) in the compound |
| 7 | [B]-1 | Compound (1) (R = CH$_3$)/ methyl methacrylate (60/40) |
| 8 | [B]-2 | Compound (9) (R = CH$_3$)/ methyl methacrylate (60/40) |
| 9 | [B]-3 | Compound (15) (R = CH$_3$)/ methyl methacrylate (60/40) |
| 10 | [B]-4 | Compound (26) (R = H)/styrene (60/40) |
| 11 | [B]-5 | Compound (31) (R = H)/styrene (60/40) |
| 12 | [B]-6 | Compound (33) (R = H)/styrene (60/40) |

EXAMPLES 13 TO 18

Six kinds of photosensitive liquids [A]-7 to [A]-12 shown in Table 3 were prepared according to the formulation for photosensitive liquid [A] given below, with the kind of the compound in the formulation being varied as specified in the table.

| Formulation for photosensitive liquid [A] | |
|---|---|
| Compound according to the invention | 0.40 g |
| Cresol (m/p = 4/6)-formaldehyde novolac resin | 1.0 g |
| Ethyl cellosolve acetate | 8.5 g |

Each photosensitive liquid was coated on a silicon wafer by means of a spinner, and then dried on a hot plate at 90° C. for 2 minutes. The film thickness was 1.0 μm.

Subsequently, the photoresist was brought into contact with a mask and exposed through the mask to 254-nm light taken out through a filter. The resulting photoresist was developed with a 2.4% aqueous solution of tetramethylammonium hydroxide for 60 seconds. As a result, a good resist pattern with 0.5-μm lines and spaces was obtained.

TABLE 3

| | Compounds for photosensitive liquids [A] | |
|---|---|---|
| Example No. | Photosensitive liquid | Compound |
| 13 | [A]-7 | Compound (50) |
| 14 | [A]-8 | Compound (65) |
| 15 | [A]-9 | Compound (69) |
| 16 | [A]-10 | Compound (78) |
| 17 | [A]-11 | Compound (88) |
| 18 | [A]-12 | Compound (96) |

EXAMPLES 19 TO 24

Six kinds of photosensitive liquids [B]-7 to [B]-12 shown in Table 4 were prepared according to the formulation for photosensitive liquid [B] given below, with the kind of the compound in the formulation being varied as specified in the table.

| Formulation for photosensitive liquid [B] | |
|---|---|
| Compound according to the invention | 0.5 g |
| Poly(p-hydroxystyrene) (manufactured by Maruzene Petrochemical Co., Ltd., Japan; weight-average molecular weight 6,000) | 1.0 g |
| Ethyl cellosolve acetate | 8.5 g |

Each photosensitive liquid was coated on a silicon wafer by means of a spinner, and then dried on a hot plate at 90° C. for 2 minutes. The film thickness was 1.0 μm.

Subsequently, the photoresist was exposed through a mask to a pulsed, 249-nm KrF excimer laser beam, and then developed with a 2.4% aqueous solution of tetramethylammonium hydroxide for 60 seconds. As a result, a good resist pattern with 0.3-μm lines and spaces was obtained.

TABLE 4

| | Compounds for photosensitive liquids [B] | |
|---|---|---|
| Example No. | Photosensitive liquid | Compound |
| 19 | [B]-7 | Compound (62) |
| 20 | [B]-8 | Compound (66) |
| 21 | [B]-9 | Compound (67) |
| 22 | [B]-10 | Compound (73) |
| 23 | [B]-11 | Compound (89) |

TABLE 4-continued

| Compounds for photosensitive liquids [B] | | |
|---|---|---|
| Example No. | Photosensitive liquid | Compound |
| 24 | [B]-12 | Compound (98) |

While the invention has been described in detail and with reference to specific embodiments thereof, it will be apparent to one skilled in the art that various changes and modifications can be made therein without departing from the spirit and scope thereof.

What is claimed is:

1. A photosensitive composition containing (a) a compound having a group represented by formula (I), said group, when irradiated with actinic radiation, forming a carboxylic acid:

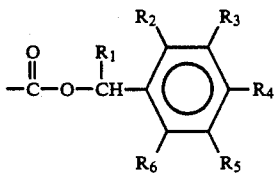

wherein
R$_1$ represents hydrogen; and
R$_2$ to R$_6$ may be the same or different and each represents hydrogen, a halogen, an alkoxyl group, an aryloxyl group, cyano group, or an alkyl group, provided that at least one or R$_2$ and R$_3$ represents an alkoxyl or aryloxyl group, and two of R$_2$ to R$_6$ may link to form a ring provided that R$_2$ and R$_3$ do not link to form a ring and (b) a resin which is insoluble in water but soluble in an aqueous solution of an alkali.

2. The photosensitive composition according to claim 1, wherein R$_2$ to R$_6$ represent hydrogen, chlorine, an alkoxyl group having 1 to 6 carbon atoms, an aryloxyl group having 6 to 15 carbon atoms, or a straight-chain or branched alkyl group having 1 to 4 carbon atoms.

3. The photosensitive composition according to claim 1, wherein the compound (a) having the group represented by formula (I) is represented by formula (VII):

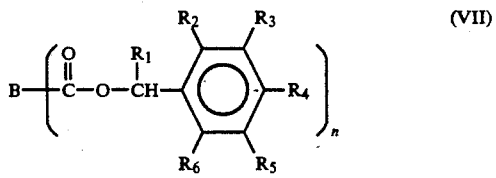

wherein
R$_1$ represents hydrogen;
R$_2$ to R$_6$ may be the same or different and each represents hydrogen, a halogen, an alkoxyl group, an aryloxyl group, cyano group, or an alkyl group, two of R$_2$ to R$_6$ may link to form a ring;
B represents an aliphatic or aromatic hydrocarbon group having a valency of n; and n is an integer of 1 or more.

4. The photosensitive composition according to claim 3, wherein B represents an aliphatic group having 1 to 30 carbon atoms or a monocyclic or polycyclic aromatic group having 6 to 20 carbon atoms, and wherein n is an integer of from 1 to 10.

5. The photosensitive composition according to claim 3, wherein the content of the compound represented by formula (VII) is from 5% to 90% by weight based on the total amount of solid components of the composition.

* * * * *